United States Patent
Wood et al.

(10) Patent No.: US 6,555,399 B1
(45) Date of Patent: *Apr. 29, 2003

(54) DOUBLE-PACKAGED MULTICHIP SEMICONDUCTOR MODULE

(75) Inventors: Alan G. Wood, Boise, ID (US);
Eugene H. Cloud, Boise, ID (US);
Larry D. Kinsman, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/650,894

(22) Filed: May 17, 1996

Related U.S. Application Data

(60) Continuation of application No. 08/402,753, filed on Mar. 10, 1995, now abandoned, which is a continuation of application No. 08/152,072, filed on Nov. 15, 1993, now abandoned, and a continuation of application No. 07/916,811, filed on Jul. 20, 1992, now abandoned, which is a division of application No. 07/675,208, filed on Mar. 26, 1991, now Pat. No. 5,155,067.

(51) Int. Cl.[7] .................. G01R 31/26; H01L 21/66; H01L 21/44; H01L 21/48

(52) U.S. Cl. .................. 438/15; 438/17; 438/109

(58) Field of Search .................. 438/15, 17, FOR 142, 438/109

(56) References Cited

U.S. PATENT DOCUMENTS

| | | | | |
|---|---|---|---|---|
| 4,080,026 A | * | 3/1978 | Gianni | 257/686 |
| 4,398,235 A | * | 8/1983 | Lutz | 361/393 |

(List continued on next page.)

FOREIGN PATENT DOCUMENTS

| | | | | |
|---|---|---|---|---|
| EP | 341504 | * | 11/1989 | 257/704 |
| GB | 2185850 | * | 7/1929 | |
| JP | 52-75981 | * | 6/1977 | 257/777 |
| JP | 58-111166 | * | 9/1983 | 437/915 |
| JP | 61-24253 | * | 2/1986 | 257/685 |
| JP | 2-198148 | * | 8/1990 | 437/208 |

Primary Examiner—David E. Graybill
(74) Attorney, Agent, or Firm—TraskBritt

(57) ABSTRACT

A method for forming a semiconductor component comprises packaging a plurality of semiconductor die into one component. Present designs comprise multiple unpackaged die which have been probed, but not rigorously tested for complete functionality and adherence to required operating specifications. The yields of present designs of multi-chip modules (MCMs) are low and functional units are therefore costly. Unlike present designs incorporating multiple die, the inventive design comprises devices which have been singularized, packaged, and thoroughly tested for functionality and adherence to required specifications. A plurality of packaged devices are then received by a housing. The conductive leads of the packaged devices are electrically coupled with pads manufactured into the housing. These pads are enjoined with traces within the housing, which terminate externally to the housing. Input/output leads are then electrically coupled with the traces, or are coupled with the traces as the housing is manufactured. The I/O leads provide means for connecting the housing with the electronic device into which it is installed. A lid received by the housing hermetically seals the packaged die in the housing, and prevents moisture or other contaminants which may impede the proper functionality of the die from entering the housing.

17 Claims, 5 Drawing Sheets

U.S. PATENT DOCUMENTS

| | | | |
|---|---|---|---|
| 4,437,235 A | * 3/1984 | McIver | 257/724 |
| 4,640,436 A | 2/1987 | Miyoshi et al. | |
| 4,663,833 A | 5/1987 | Tanaka et al. | |
| 4,682,207 A | * 7/1987 | Akasaki et al. | 257/724 |
| 4,709,122 A | 11/1987 | Samuels | |
| 4,727,410 A | * 2/1988 | Higgins, III | 257/704 |
| 4,746,583 A | * 5/1988 | Falanga | |
| H606 H | * 3/1989 | Ahn et al. | |
| 4,873,615 A | * 10/1989 | Grabbe | 257/696 |
| 4,894,706 A | * 1/1990 | Sato et al. | 257/686 |
| 4,901,136 A | * 2/1990 | Neugebauer et al. | 257/724 |
| 4,943,844 A | 7/1990 | Oscilowski et al. | |
| 4,953,005 A | * 8/1990 | Carlson et al. | 257/686 |
| 4,982,265 A | * 1/1991 | Watanabe et al. | 174/52.4 |
| 4,992,850 A | 2/1991 | Corbett et al. | |
| 4,996,587 A | 2/1991 | Hinrichsmeyer et al. | |
| 5,008,734 A | 4/1991 | Dutta et al. | |
| 5,010,445 A | * 4/1991 | Weinold | 361/392 |
| 5,028,986 A | * 7/1991 | Sugano et al. | 257/686 |
| 5,036,381 A | 7/1991 | Lin | |
| 5,070,258 A | * 12/1991 | Izumi et al. | 361/395 |
| 5,089,929 A | * 2/1992 | Hilland | 257/686 |
| 5,138,438 A | * 8/1992 | Masayuki | 257/686 |
| 5,155,067 A | * 10/1992 | Wood et al. | |
| 5,165,067 A | * 11/1992 | Wakefield et al. | |
| 5,227,664 A | * 7/1993 | Toshio et al. | 257/686 |
| 5,304,738 A | * 4/1994 | Long | |
| 5,394,608 A | * 3/1995 | Tottori et al. | 29/840 |
| 5,420,751 A | * 5/1995 | Burns | 361/707 |
| 5,446,620 A | * 8/1995 | Burns et al. | 361/704 |

* cited by examiner

DOUBLE-PACKAGED MULTICHIP SEMICONDUCTOR MODULE

CROSS-REFERENCE TO RELATED APPLICATIONS

This application is a continuation of application Ser. No. 08/402,753 filed Mar. 10, 1995, abondoned, which is a continuation of application Ser. No. 08/152,072 filed Nov. 15, 1993, (abandoned) and a continuation of application Ser. No. 07/916,811 filed Jul. 20, 1992, abondoned, which is a division of application Ser. No. 07/675,208 filed Mar. 26, 1991, U.S. Pat. No. 5,155,067.

Field of the Invention

This invention relates to the field of semiconductors, a type of multi-chip module.

BACKGROUND OF THE INVENTION

Many types of semiconductor devices are made using similar manufacturing procedures. A starting substrate, usually a thin wafer of silicon, is doped, masked, and etched through several process steps, the steps depending on the type of devices being manufactured. This process yields a number of die on each wafer produced. Each die on the wafer is given a brief test for functionality, and the nonfunctional die are mechanically marked or mapped in software. This brief test is only a gross measure of functionality, and does not insure that a die is completely functional or has specifications that would warrant its assembly in a package.

If the wafer has a yield of grossly functional die which indicates that a good quantity of die from the wafer are likely to be fully operative, the die are separated with a die saw, and the nonfunctional die are scrapped while the rest are individually encapsulated in plastic packages or mounted in ceramic packages with one die in each package. After the die are packaged they are rigorously tested. Components which are shown to be nonfunctional or which operate at questionable specifications are scrapped or devoted to special uses.

Packaging unusable die only to scrap them after testing is costly. Given the relatively low profit margins of commodity semiconductor components such as dynamic random access memories (DRAMs) and static random access memories (SRAMs), this practice would seem especially wasteful. However, no thorough and cost effective method of testing an unpackaged die is available which would prevent this unnecessary packaging of nonfunctional and marginally functional die.

The practice of packaging die only to find the component must be scrapped can especially affect yields on multi-chip modules (MCMs). With MCMs, several unpackaged die are assembled into a single component, then the component is tested as a single functional unit. If a single die is nonfunctional or operates outside of acceptable specifications, the entire component fails and all die in the package are scrapped or an attempt is made to "re-work" the MCM. There is presently no cost-effective way to reclaim the functioning die. Statistically, the yields of MCMs decrease in proportion to the increasing number of die in each module. The highest density modules have the lowest yields due to their increased total silicon surface area.

SUMMARY OF THE INVENTION

An object of this invention is to provide a MCM which has a higher probability of receiving only good die as compared with present MCMs of equal density. This produces a higher yield.

This and other objects of the present invention are accomplished by packaging each die individually, for example in a thin small outline package (TSOP), testing the components including use of burn-in to eliminate "infant mortality" failing, then assembling a number of functional packaged components together in a single multi-chip module.

BRIEF DESCRIPTION OF THE DRAWINGS

The preferred embodiments of the invention are illustrated in the accompanying drawings, in which.

DESCRIPTION OF THE PREFERRED EMBODIMENT

Figure 1:
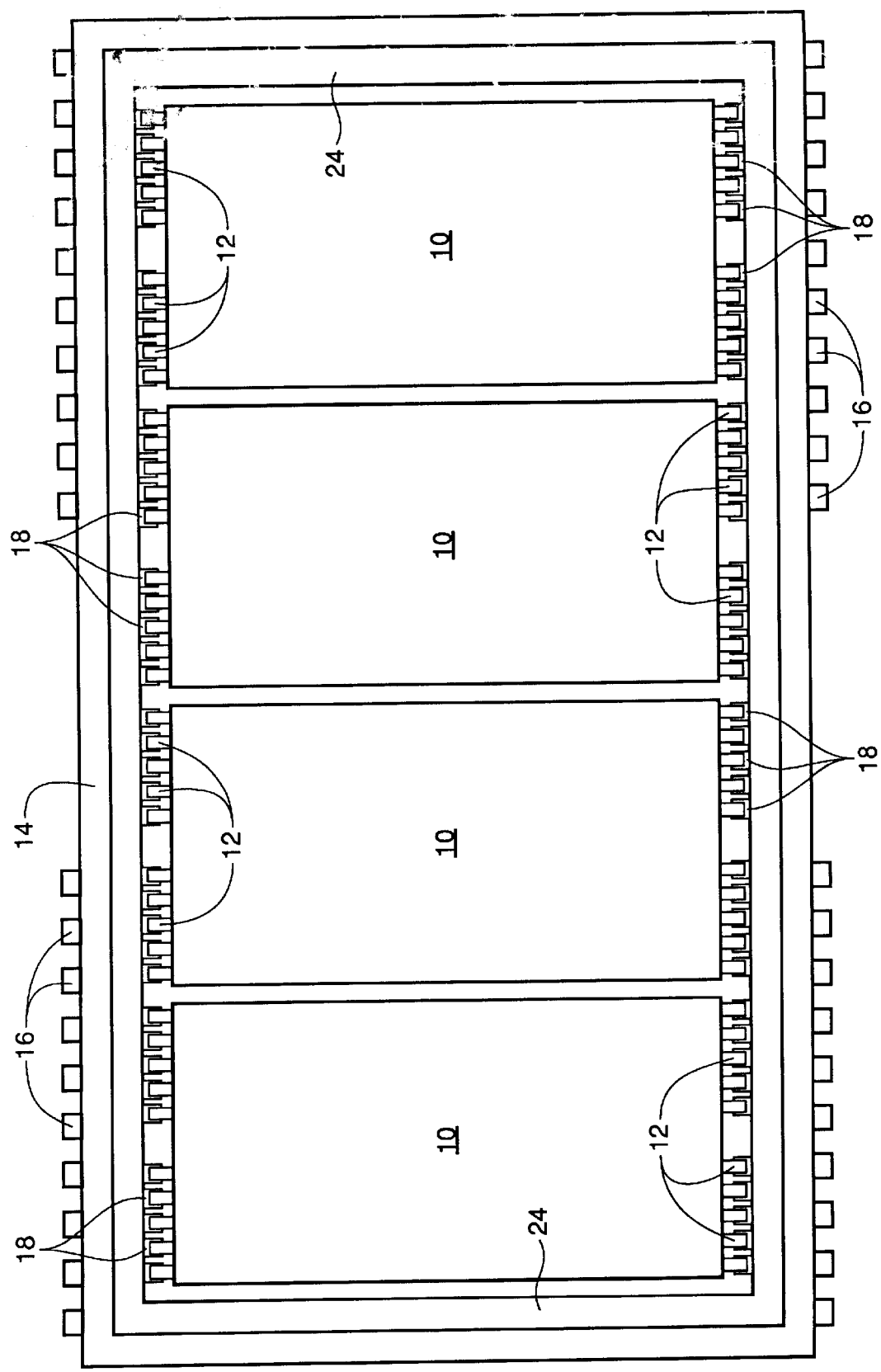
FIG. 1 is a top view of an embodiment employing four Type I TSOP packages.
Figure 2:
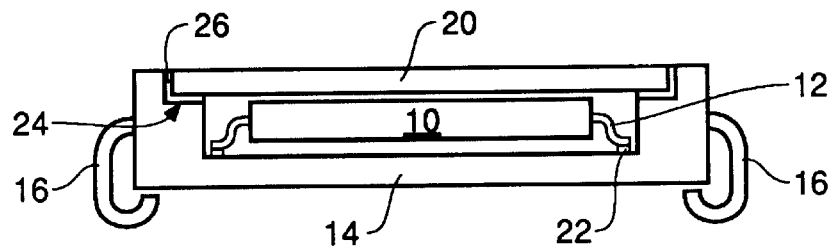
FIG. 2 is a side cutaway view of the FIG. 1 embodiment.

FIGS. 1 (top view) and 2 (side view) show an embodiment of the invention incorporating four individually packaged die (not shown), with each TSOP package 10 having gull-wing style leads 12. The MCM housing 14 is shown with SOJ style I/O leads 16. The invention comprises a number of die which could have been packaged according to normal production procedures for sale as regular commodity devices, or could be manufactured especially for use in a MCM. The packages shown 10 are Type I TSOP packages, but Type II TSOP, SIP, DIP, ZIP, or various other package types could be used with the invention. TSOPs, however, have the advantage of being very small and thin, in fact not much larger than unpackaged die, and therefore provide for a very small assembled MCM, which is one reason for the development of MCMs.

The housing 14 can be manufactured from ceramic, plastic, composite (graphite/ceramic, etc.), or other workable material. The housing 14 has conductive pads 18 for electrical attachment of the leads 12 of the packages 10. The pads 18 are coupled with traces (not shown) manufactured into the housing 14 which provide an electrical pathway from the leads 12 on the packages 10 to the outside of the housing 14. The actual pinouts of the traces manufactured into the housing 14 depend on the design and intended use of the module. Traces of this type have been used with ceramic semiconductor packages. The conductive traces (not shown) within the housing 14 are attached to the conductive leads 16 of the housing 14 by means such as side brazing. Alternately, surface mount type leads 16, such as the small outline "J" (SOJ) leads shown, can be attached to the traces and manufactured into the housing 14, thereby being firmly attached to the housing 14. The manufacture of SOJ lead types, as well as other lead types, are well known in the art.

To assemble the MCM, the packages 10 are inserted into the housing 14, and the leads 12 of the packages 10 are electrically coupled to the pads 18 of the housing 14 by coupling means 22 such as solder, conductive epoxy, conductive polymer, wire bonding, tape automated bonding, or other workable means.

After the leads 12 of the packages 10 are coupled with the pads 18 of the housing 14, a lid 20 is attached to the housing 14 to seal the packages 10 in the housing 14. The lid 20 can be plastic, ceramic, metallic, or composite, depending on the type of material from which the housing 14 is made. With some materials, such as ceramic and glass, the lid 20 will provide a hermetic seal. A hermetic seal will resist the entrance of moisture or other substances, which might cause the package 10 to malfunction, into the housing 14. The lid 20 can be attached directly to the flat surface of the housing 14, or a recess 24 can be manufactured into the top surface of the housing 14 to receive the lid 20. The attachment means 26 varies with the type of material used to make the lid 20. With a plastic or composite lid and housing, either an epoxy or a polyamide material, both of which are known in the art, can be used with equal success to enjoin the lid 20 to the housing 14. In ceramic embodiments, some sealing means are more costly but more reliable, and could be used in high-stress situations. Other lower cost adhesives will work for normal usages. Glass is one high reliability attachment means which can be used to attach a ceramic or metal lid to a ceramic housing. Another high reliability adhesive is solder. Polyamide and epoxy are two medium reliability attachment means.

Figure 4:
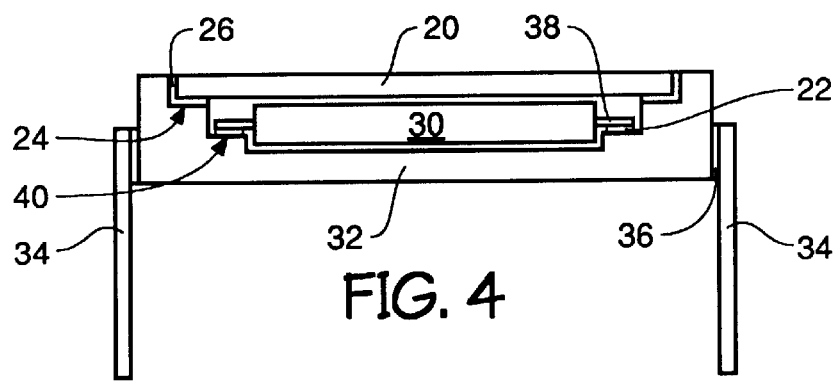
FIG. 4 is a side cutaway view of the FIG. 3 embodiment.
Figure 3:
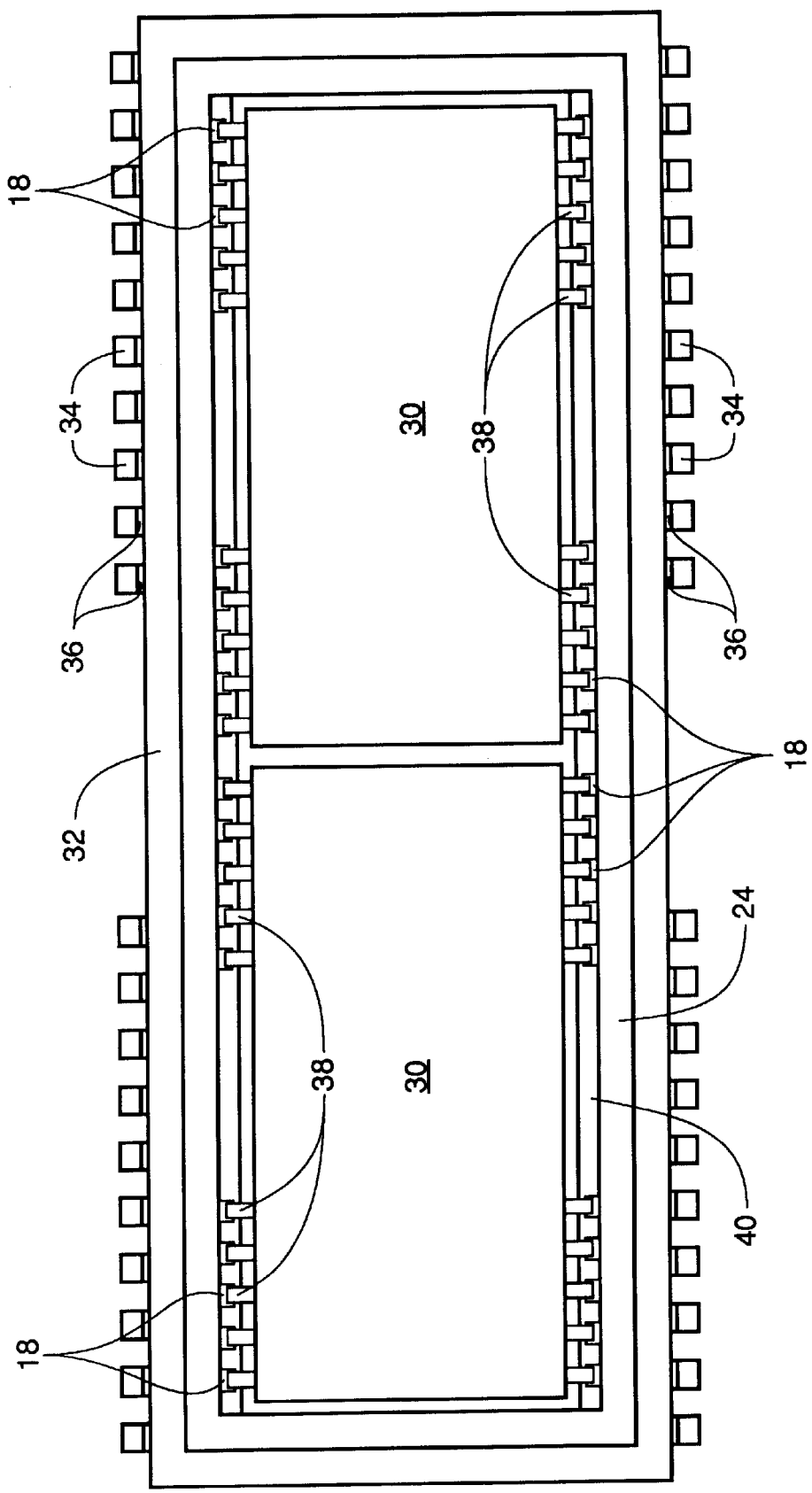
FIG. 3 is a top view of an embodiment employing two Type II TSOP packages.

FIGS. 3 and 4 show an embodiment of the invention incorporating die (not shown) packaged in Type II TSOP packages 30. Many of the elements of this embodiment are similar to the elements of the previously described embodiment.

In the present embodiment, through-hole DIP leads 34 are brazed 36 to the side of the housing 32 thereby coupling with traces (not shown) manufactured into the housing 32. This embodiment incorporates packages 30 with leads 38 specially formed for use with the invention. The leads 38 extend directly out from the body of the package 30 and rest on a shelf 40 manufactured as an element of the housing 32. Upon the shelf 40 are conductive pads 18 which connect with traces (not shown) manufactured into the housing 32 which run to the outside of the housing 32.

Figure 6:
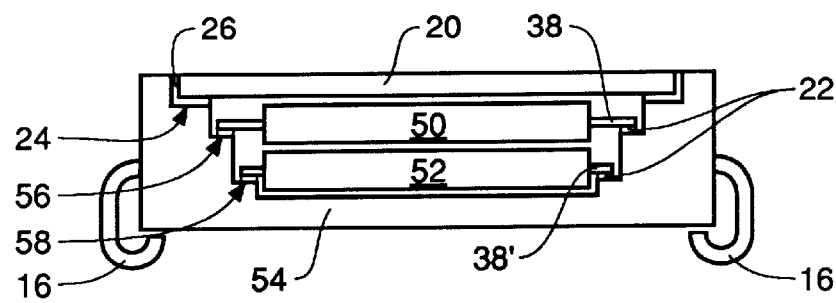
FIG. 6 is a side cutaway view of the FIG. 5 embodiment.
Figure 5:
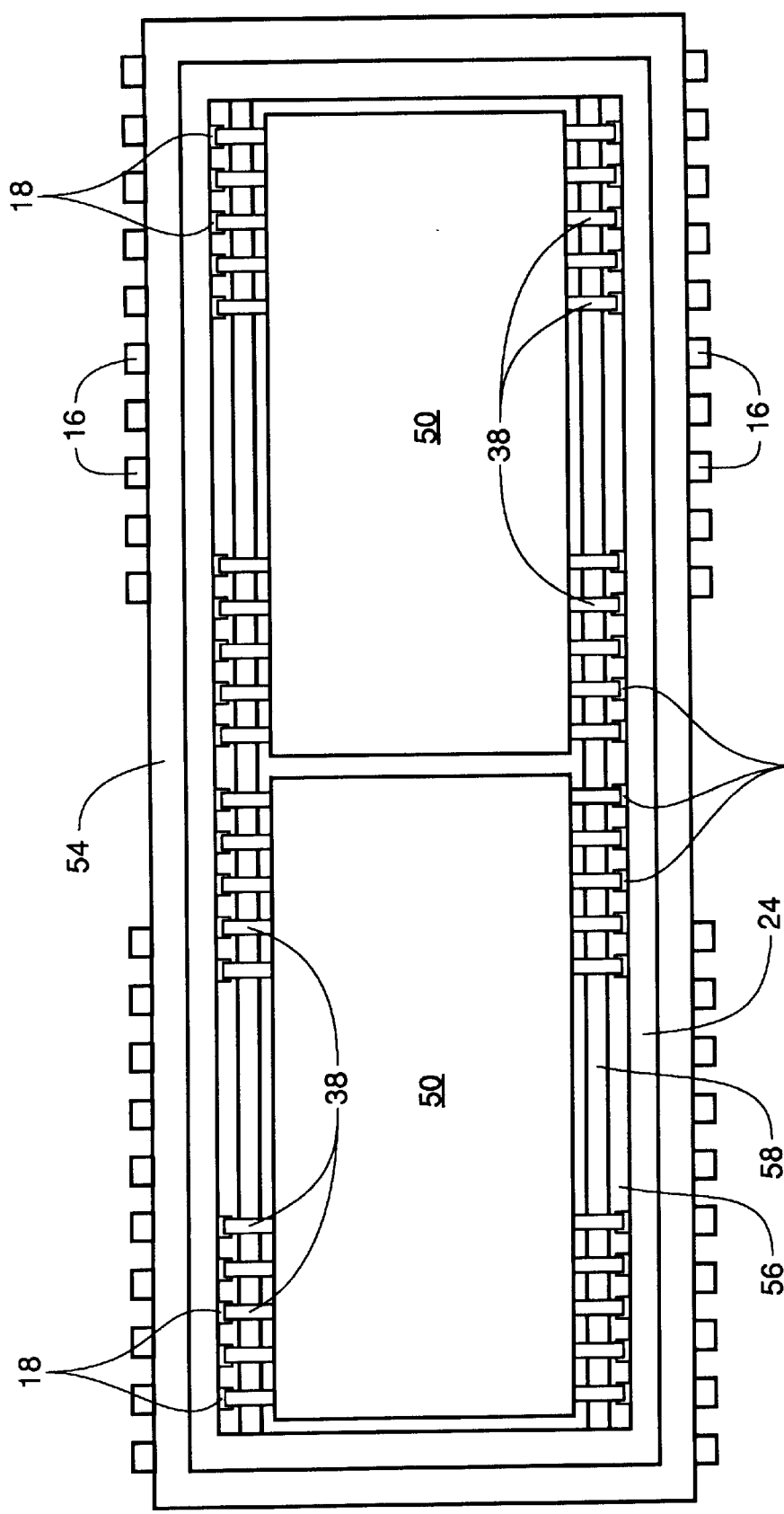
FIG. 5 is a top view of an embodiment employing four Type II TSOP packages in a stacked arrangement.

FIGS. 5 and 6 show a MCM having two semiconductor packages 50, 52, one 50 stacked on top of the other 52, which provides a higher density module. The MCM can have several stacks of devices, depending on the MCM density specification. In the present embodiment, the housing 54 is manufactured with two shelves 56, 58 of different levels, with each level having pads 18 for coupling the leads 38, 38' of the packages 50, 52. Traces (not shown) manufactured into the housing 54 couple with the pads 18, and terminate externally to the housing 54. Packages 52 are placed in the housing 54 and the leads 38' are electrically coupled with pads (not shown) on the lower shelf 58. The upper level of semiconductor packages 50 are placed the housing 54 and the leads 38 are electrically coupled with pads 18 on the upper shelf 56. The embodiment of FIGS. 5 and 6 may require that leads 38, 38' on the packages 50, 52 be formed especially for use with the inventive module. The package leads 38 for use on the upper shelf 56 have a greater distance to span than the package leads 38' for use on the lower shelf 58. Rather than forming different lengths of leads, it is possible to use a package with one type of lead on the lower shelf such as a straight lead, and a package with a different type of lead on the upper shelf such as a gull wing or J lead.

Figure 7:
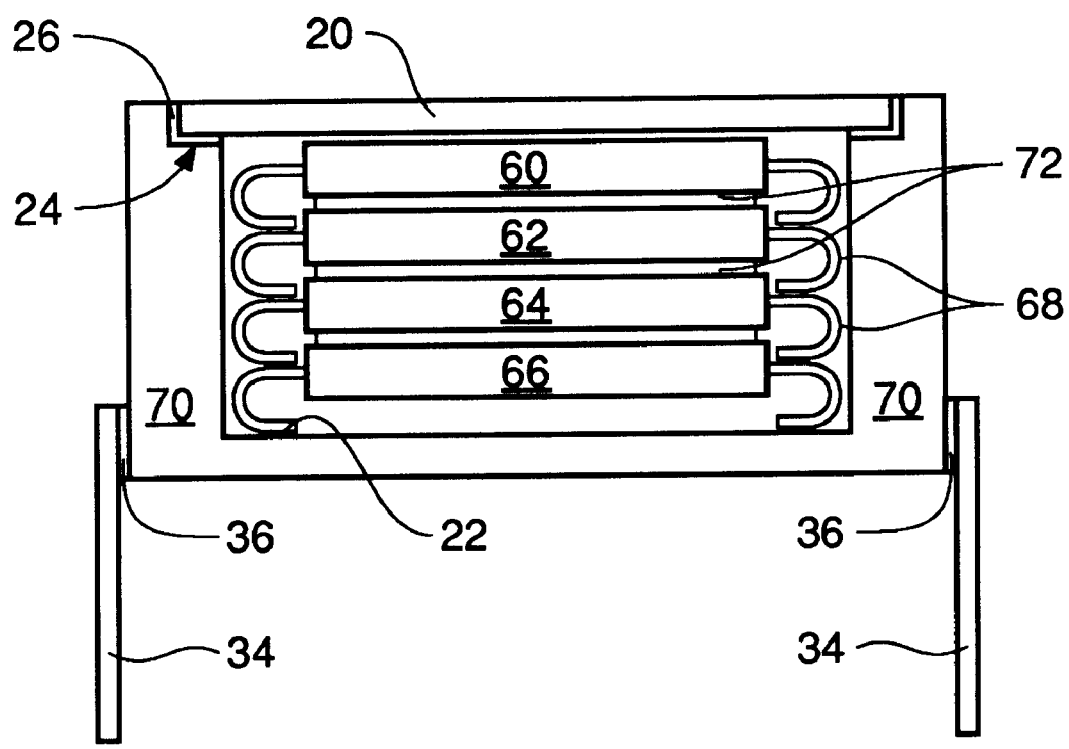
FIG. 7 is a side cutaway view of an embodiment employing packages stacked four high.

FIG. 7 describes an MCM having a plurality of stacked semiconductor packages 60, 62, 64, 66. In this stacked embodiment, TSOP packages are used which have been produced especially for use in the inventive module. In the embodiment of FIG. 7, four TSOP devices are stacked or "piggybacked" one on top of another. The leads 68 are electrically coupled with the same output leads of the device below it, with the leads 68 of the bottom device 66 being coupled with pads (not shown) on the housing 70.

To access the data from an MCM having multiple DRAM devices, the DRAMs housed in the MCM must be fabricated with more than one CAS pin. The number of CAS pins on each DRAM must equal (or exceed) the number of packages in the housing. Each device will have only one CAS pin active, the others being "no connects." In an embodiment with four DRAM packages, each package will have one active CAS and three CAS no connects, the CAS pins on each device being numbered CAS0, CAS1, CAS2, and CAS3. In the bottom device, CAS0 will be connected to CAS on the die within, and CAS1–CAS3 will be no connects. On the second device, CAS1 is connected to CAS on the die within, and CAS0, CAS2, and CAS3 are no connects. The third device has only CAS2 active, and the top device has only CAS3 active. If stacked packages as described are used, it is invalid for more than one package to have RAS and CAS both active simultaneously. The MCM of this embodiment would contain four different designs of DRAM devices, and the housing would also require four CAS pins designated CAS0–CAS3. This design allows piggybacked devices and therefore a very small, highly dense module.

If SRAMs are used in the housing 70, each SRAM package is fabricated with a number of chip enable (CE) pins, the number of pins corresponding the number of bits required for chip select. In an embodiment with four SRAM packages, two bits are necessary to select only one of the four devices in the stack. This requires two bits, so each SRAM package will have two CE pins, CE0 and CE1. A laser blown fuse, a current blown fuse, or another type of workable fuse on each CE pin selects the binary code which will activate a particular SRAM device. On the bottom package, for example, both fuses will be blown causing the bottom chip to respond to a 0 on both CE0 and CE1 (0,0). On the second package, only CE1 will be blown, causing the second SRAM package to respond to a 0,1. The third package will respond to 1,0 while the top device to corresponds to 1,1. The MCM of this embodiment, therefore, would contain four different types of devices and the housing would require two CE pins designated CE0 and CE1. This design allows four piggybacked SRAM TSOP devices and therefore a very small, highly dense module.

In a piggybacked embodiment, only the leads 68 of the bottom device 66 are physically coupled to the housing, its leads being connected by solder reflow, conductive epoxy, or other workable means. To provide added support to the devices 60, 62, 64, 66 to prevent excess stress on the leads 68, the packages themselves can be connected with a material 72 such as nonconductive epoxy, organic resin, polyamide, nonconductive polymer, or with other workable means. The embodiment again shows the use of DIP style leads 34 on the housing 70, but other lead designs as previously described are also workable and may be preferable for some applications.

Using the method described a module can be produced which has short trace lengths and transfers data quickly between the multiple die contained in the MCM and the system into which the MCM is installed. The inventive module has the advantage of using only fully tested and burned in die. Present designs of MCMs comprise several untested or poorly tested die packaged together. The package is fully tested only after the module is assembled. With present designs, if a single die is not functional the entire assembly is scrapped, including any functional die packaged in the module or attempts are made to rework the MCM by replacing all malfunctioning die. The inventive design allows for the assembly of only functional die and yields are increased.

In addition to supplying memory, the invention provides a convenient method to package different types of components in the same housing, for example a microprocessor (MPU) together with a primary or secondary cache memory. MPUs and cache memory are increasing used together in computers, and a module which supplies both would be an effective and desirable computer component.

What have been described are specific configurations of the invention, as applied to particular embodiments. Clearly, variations can be made to the original designs described in this document for adapting the invention to other embodiments. For example, the housing can be manufactured with different lead types, or semiconductor packages with different lead types can be packaged in the housing. The MCM can also be manufactured with x1, x4, x16, or x32 data widths, or with other data widths not specifically mentioned. The number of devices in a particular described embodiment is not the important element. For example, in the embodiment of FIGS. 5 and 6, a plurality of devices other than four can be stacked, and fewer or more than four stacks can be designed. Therefore, the invention should be read as limited only by the appended claims.

What is claimed is:

1. A method for fabricating a multi-chip-module comprising:
    a) providing a plurality of semiconductor packages, each package comprising a plurality of package leads and a semiconductor die;
    b) testing the packages, by performing functionality testing, adherence to required specifications testing, and burn-in testing;
    c) providing a housing for retaining the packages comprising a plurality of conductive traces and a plurality of external leads in electrical communication with the traces;
    d) placing passing packages from the testing step within the housing and electrically coupling the passing packages and the conductive traces; and
    e) sealing the passing packages within the housing.

2. The method of claim 1 wherein the packages comprises memory devices.

3. The method of claim 1 wherein the packages comprises a device selected from the group consisting of dynamic random access memories (DRAMs) and static random access memories (SRAMs).

4. The method of claim 1 wherein at least one passing package comprises a microprocessor (MPU).

5. The method of claim 1 wherein a first package of the packages comprises a microprocessor (MPU) and a second package of the packages comprises a memory device.

6. The method of claim 1 wherein the conductive traces comprise pads.

7. The method of claim 1 wherein electrically coupling the passing packages and the conductive traces comprises a method selected from the group consisting of soldering, wire bonding and tape automated bonding.

8. The method of claim 1 wherein electrically coupling the passing packages and the conductive traces comprises placing a conductive polymer therebetween.

9. The method of claim 1 wherein the passing packages and the conductive traces comprises a conductive epoxy placed therebetween.

10. The method of claim 1 wherein the packages comprise a package selected from the group consisting of thin small outline packages (TSOPs), single in line packages (SIPs), dual in line packages (DIPs), and zig zag in line packages (ZIPs).

11. A method for fabricating a multi-chip-module comprising:
    a) providing a plurality of semiconductor packages, each package comprising a plurality of package leads and a semiconductor die in electrical communication with the package leads;
    b) testing each package by performing functionality testing, adherence to required specifications testing, and burn-in testing;
    c) providing a housing comprising a recess, a plurality of external leads and a plurality of conductive traces in electrical communication with the external leads;
    d) placing passing packages from the testing step within the recess and placing a conductive polymer between package leads on the passing packages and the conductive traces; and
    e) attaching a lid to the housing to hermetically seal the passing packages within the housing.

12. The method of claim 11 wherein the conductive traces comprise pads, for electrically connecting a corresponding package lead on a passing package thereto.

13. The method of claim 11 wherein the conductive polymer comprises epoxy.

14. A method for fabricating a multi chip module comprising:
    providing a plurality of packaged semiconductor memory devices;
    testing the devices by performing functionality testing, adherence to required specifications testing, and burn-in testing;
    retaining passing devices from the testing step;
    providing a housing comprising a plurality of external leads and a plurality of conductive traces in electrical communication with the external leads;
    mounting the passing devices within the housing and electrically attaching selected package leads on the passing devices to corresponding conductive traces on the housing; and
    following mounting, hermetically sealing the passing devices within the housing.

15. The method of claim 14 wherein hermetically sealing the passing devices comprises attaching a lid to the housing.

16. The method of claim 14 further comprising stacking a plurality of the passing devices within the housing in electrical communication with one another.

17. The method of claim 14 wherein the memory devices comprise a device selected from the group consisting of dynamic random access memories (DRAMs) and static random access memories (SRAMs).

* * * * *

UNITED STATES PATENT AND TRADEMARK OFFICE
CERTIFICATE OF CORRECTION

PATENT NO.     : 6,555,399 B1                                                Page 1 of 1
DATED          : April 29, 2003
INVENTOR(S)    : Alan G. Wood et al.

It is certified that error appears in the above-identified patent and that said Letters Patent is hereby corrected as shown below:

<u>Title page, Item [54] and Column 1, line 1,</u>
Change "MULTICHIP" to -- MULTI-CHIP --

<u>Column 1,</u>
Lines 8 and 11, change "abondoned" to -- abandoned --
Line 17, after "semiconductors," and before "a" insert -- and, more specifically to a method for manufacturing --

<u>Column 3,</u>
Line 52, after "placed" and before "the" insert -- in --

<u>Column 5,</u>
Lines 46 and 48, change "comprises" to -- comprise --
Line 53, at the beginning of the line before "packages" insert -- plurality of --

<u>Column 6,</u>
Lines 30-31, change the comma after "pads" to a period and delete "for electrically connecting a corresponding package lead on a passing package therein."

Signed and Sealed this

Ninth Day of September, 2003

JAMES E. ROGAN
*Director of the United States Patent and Trademark Office*